United States Patent
Walker et al.

(10) Patent No.: US 11,722,138 B2
(45) Date of Patent: Aug. 8, 2023

(54) DYNAMIC POWER AND THERMAL LOADING IN A CHIPLET-BASED SYSTEM

(71) Applicant: Micron Technology, Inc., Boise, ID (US)

(72) Inventors: Dean E. Walker, Allen, TX (US); Tony Brewer, Plano, TX (US); David Patrick, McKinney, TX (US); Michael Grassi, Shokan, NY (US); Bryan Hornung, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 298 days.

(21) Appl. No.: 17/075,016

(22) Filed: Oct. 20, 2020

(65) Prior Publication Data

US 2022/0123752 A1 Apr. 21, 2022

(51) Int. Cl.
| | |
|---|---|
| *H03K 19/003* | (2006.01) |
| *G06F 13/16* | (2006.01) |
| *H01L 23/538* | (2006.01) |
| *H03K 19/0175* | (2006.01) |

(52) U.S. Cl.
CPC ............ *H03K 19/00369* (2013.01); *G06F 13/1668* (2013.01); *H01L 23/5386* (2013.01); *H03K 19/017509* (2013.01)

(58) Field of Classification Search
None
See application file for complete search history.

(56) References Cited

U.S. PATENT DOCUMENTS

| | | | |
|---|---|---|---|
| 2007/0121698 A1* | 5/2007 | Johns | G01K 3/005 374/57 |
| 2013/0060399 A1 | 3/2013 | Ahuja et al. | |
| 2014/0281311 A1* | 9/2014 | Walker | G06F 3/0631 711/170 |
| 2014/0317425 A1 | 10/2014 | Lien et al. | |
| 2018/0039777 A1* | 2/2018 | Loh | H04L 63/1458 |
| 2019/0041969 A1* | 2/2019 | Nge | G06F 9/4893 |
| 2019/0042270 A1* | 2/2019 | Willis | G06F 9/3885 |
| 2019/0204885 A1 | 7/2019 | Ahuja et al. | |
| 2020/0105722 A1* | 4/2020 | Sethuraman | H01L 23/34 |

OTHER PUBLICATIONS

"International Application Serial No. PCT US2021 054210, International Search Report dated Feb. 3, 2022", 4 pgs.
"International Application Serial No. PCT US2021 054210, Written Opinion dated Feb. 3, 2022", 5 pgs.

* cited by examiner

*Primary Examiner* — Crystal L Hammond
(74) *Attorney, Agent, or Firm* — Schwegman Lundberg & Woessner, P.A.

(57) ABSTRACT

A chiplet system comprises an interposer including interconnect and multiple chiplets arranged on the interposer and interconnected using the interconnect of the interposer. The multiple chiplets include a throttle level bus source chiplet including a throttle level bus drive interface configured to place a throttle level value onto the throttle level bus, and one or more throttle level bus receiver chiplets operatively coupled to the throttle level bus. Each chiplet of the multiple chiplets includes throttling logic circuitry configured to set a throttle level of a chiplet according to the throttle level value.

22 Claims, 5 Drawing Sheets

DYNAMIC POWER AND THERMAL LOADING IN A CHIPLET-BASED SYSTEM

TECHNICAL FIELD

Embodiments of the disclosure relate generally to electronic devices that include chiplets and more specifically to a chiplet architecture that provides power management for a chiplet-based system.

BACKGROUND

Electronic system design using chiplets is a technique for integrating various processing functionalities. Generally, a chiplet system is made up of discreet chips (e.g., integrated circuits (ICs) on different substrate or die) that are integrated on an interposer and packaged together. This arrangement is distinct from single chips (e.g., ICs) that contain distinct device blocks (e.g., intellectual property (IP) blocks) on one substrate (e.g., single die), such as a system-on-a-chip (SoC), or discreetly packaged devices integrated on a board. In general, chiplets provide better performance (e.g., lower power consumption, reduced latency, etc.) than discreetly packaged devices, and chiplets provide greater production benefits than single die chips. These production benefits can include higher yields or reduced development costs and time.

Chiplet systems are generally made up of one or more application chiplets and support chiplets. Here, the distinction between application and support chiplets is simply a reference to the likely design scenarios for the chiplet system. Thus, for example, a synthetic vision chiplet system can include an application chiplet to produce the synthetic vision output along with support chiplets, such as a memory controller chiplet, sensor interface chiplet, or communication chiplet. In a typical use case, the designer can design the application chiplet and source the support chiplets from other parties. Thus, the design expenditure (e.g., in terms of time or complexity) is reduced because by avoiding the design and production of functionality embodied in the support chiplets. Chiplets also support the tight integration of IP blocks that can otherwise be difficult, such as those using different feature sizes. Thus, for example, devices designed during a previous fabrication generation with larger feature sizes, or those devices in which the feature size is optimized for the power, speed, or heat generation (e.g., for sensor applications) can be integrated with devices having different feature sizes more easily than attempting to do so on a single die. Additionally, by reducing the overall size of the die, the yield for chiplets tends to be higher than that of more complex, single die devices.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, various embodiments discussed in the present document.

DETAILED DESCRIPTION

Embodiments of the present disclosure are directed to controlling power consumption and thermal loading of electronic systems that include chiplets. The system may include chiplets that each perform a different function, or the chiplets may perform the same function, but configuring multiple chiplets together (e.g., to implement parallelism of the function) results in a higher performance solution. The chiplets may be arranged in a tightly packed matrix to create a higher performance functional block in a minimum footprint. When a chiplet system is used in different applications, each application may have different electrical supply rail and thermal cooling capabilities. Without a means to mitigate the power and thermal dissipation, the system would be limited for operation within the worst-case power and cooling environment. Limiting the system in this way would potentially reduce the performance of intensive applications that could take advantage of appropriate powering and cooling techniques. The systems, devices, and methods described herein allow a single chiplet system design to run at multiple corners of the power and thermal envelopes of operation while delivering the maximum available performance at any given corner.

Figure 1A:
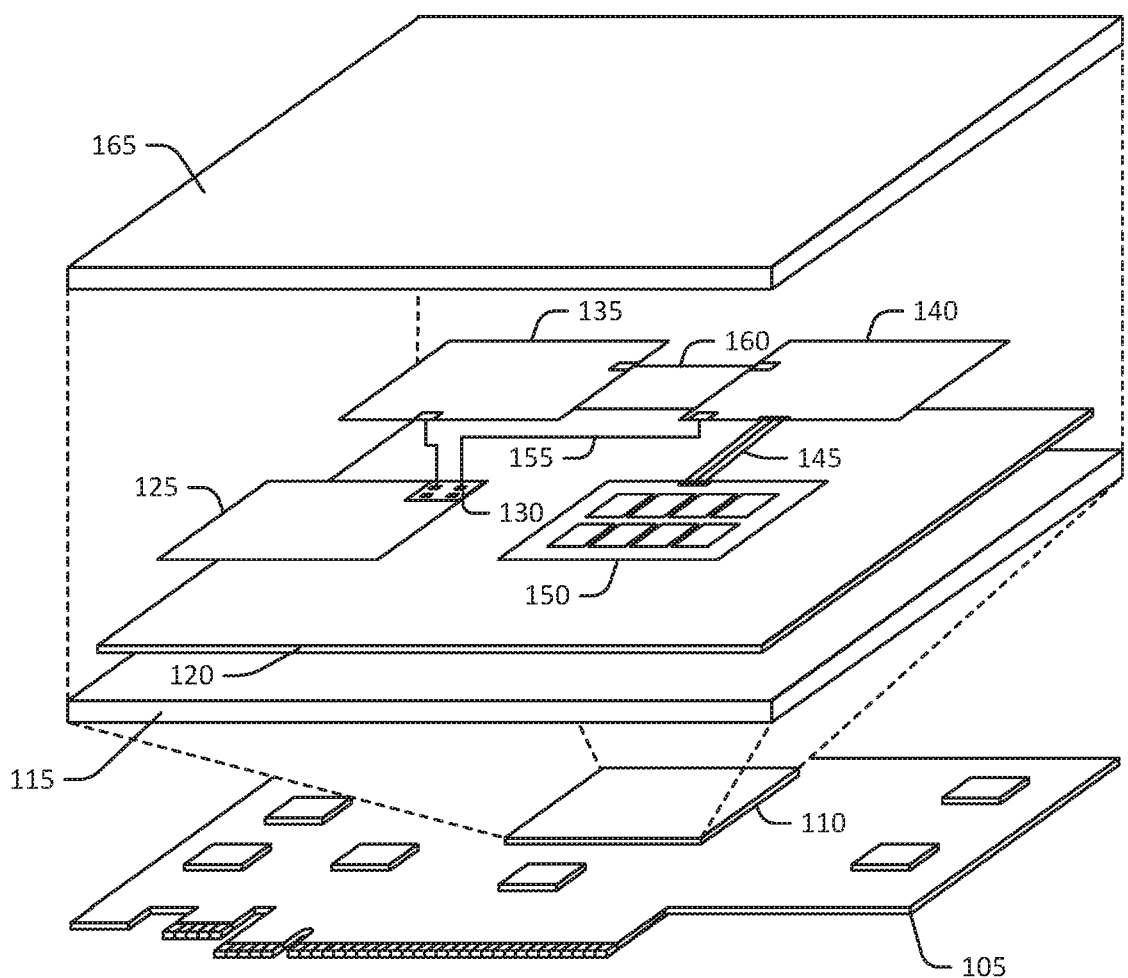
FIGS. 1A-1B illustrate an example of a chiplet system, in accordance with some examples described herein.
Figure 1B:
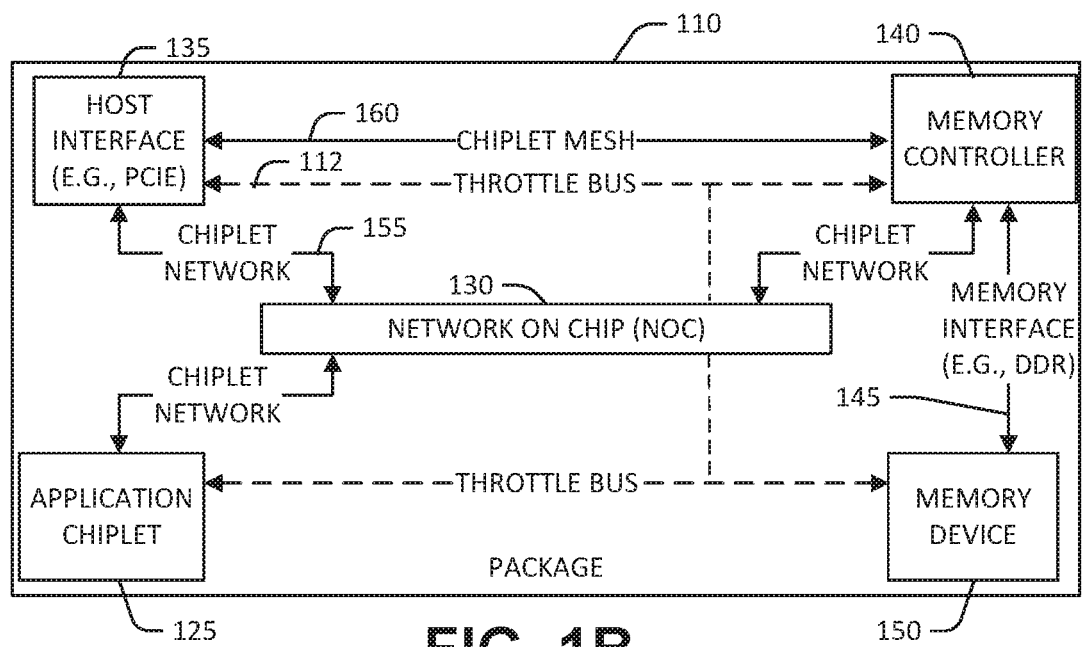

FIGS. 1A and 1B illustrate an example of a chiplet system 110. FIG. 1A is a representation of the chiplet system 110 mounted on a peripheral board 105, that can be connected to a broader computer system by a peripheral component interconnect express (PCIe), for example. The chiplet system 110 includes a package substrate 115, an interposer 120, and four chiplets; an application chiplet 125, a host interface chiplet 135, a memory controller chiplet 140, and a memory device chiplet 150. The package of the chiplet system 110 is illustrated with a lid 165, though other covering techniques for the package can be used. FIG. 1B is a block diagram labeling the components in the chiplet system for clarity.

The application chiplet 125 is illustrated as including a network-on-chip (NOC) 130 to support an inter-chiplet communications network, or chiplet network 155. The NOC 130 is generally included on the application chiplet 125 because it is usually created after the support chiplets (e.g., chiplets 135, 140, and 150) are selected, thus enabling a designer to select an appropriate number of chiplet network connections or switches for the NOC 130. In an example, the NOC 130 can be located on a separate chiplet, or even within the interposer 120. In an example, the NOC 130 implements a chiplet protocol interface (CPI) network.

A CPI network is a packet-based network that supports virtual channels to enable a flexible and high-speed interaction between chiplets. CPI enables bridging from intra-chiplet networks to the chiplet network 155. For example, the Advanced eXtensible Interface (AXI) is a widely used specification to design intra-chip communications. AXI specifications, however, cover a great variety of physical design options, such as the number of physical channels, signal timing, power, etc. Within a single chip, these options are generally selected to meet design goals, such as power consumption, speed, etc. To achieve the flexibility of the chiplet system, CPI is used as an adapter to interface between the various AXI design options that can be used across the various chiplets. By enabling a physical channel to virtual channel mapping and encapsulating time-based signaling with a packetized protocol, CPI successfully bridges intra-chiplet networks across the chiplet network 155.

CPI can use a variety of different physical layers to transmit packets. The physical layer can include simple conductive connections or include drivers to transmit the signals over longer distances or drive greater loads. An example of one such physical layer can include the Advanced Interface Bus (AIB), implemented in the interposer 120. AIB transmits and receives data using source synchronous data transfers with a forwarded clock. Packets are transferred across the AIB at single data rate (SDR) or dual data rate (DDR) with respect to the transmitted clock. Various channel widths are supported by AIB. AIB channel widths are in multiples of 20 bits when operated in SDR mode (20, 40, 60, . . . ), and 40 bits for DDR mode: (40, 80, 120, . . . ). The AIB channel width includes both transmit and receive signals. The channel can be configured to have a symmetrical number of transmit (TX) and receive (RX) I/Os, or have a non-symmetrical number of transmitters and receivers (e.g., either all transmitters or all receivers). The AIB channel can act as an AIB master or slave depending on which chiplet provides the master clock. AIB I/O cells support three clocking modes: asynchronous (i.e. non-clocked). SDR, and DDR. The non-clocked mode is used for clocks and some control signals. The SDR mode can use dedicated SDR only I/O cells, or dual use SDR/DDR I/O cells.

In an example, CPI packet protocols (e.g., point-to-point or routable) can use symmetrical receive and transmit I/O cells within an AIB channel. The CPI streaming protocol allows more flexible use of the AIB I/O cells. In an example, an AIB channel for streaming mode can configure the I/O cells as all TX, all RX, or half RX and half RX. CPI packet protocols can use an AIB channel in either SDR or DDR operation modes. In an example, the AIB channel is configurable in increments of 80 I/O cells (i.e. 40 TX and 40 RX) for SDR mode and 40 I/O cells for DDR mode. The CPI streaming protocol can use an AIB channel in either SDR or DDR operation modes. Here, in an example, the AIB channel is in increments of 40 I/O cells for both SDR and DDR modes. In an example, each AIB channel is assigned a unique interface identifier. The interface identifier is used during CPI reset and initialization to determine paired AIB channels across adjacent chiplets. In an example, the interface identifier is a 20-bit value comprising a seven-bit chiplet identifier, a seven-bit column identifier, and a six-bit link identifier. The AIB physical layer transmits the interface identifier using an AIB out-of-band shift register. The 20-bit interface identifier is transferred in both directions across an AIB interface using bits 32-51 of the shift registers.

AIB defines a stacked set of AIB channels as an AIB channel column. An AIB channel column has some number of AIB channels, plus an auxiliary channel that can be used for out-of-band signaling. The auxiliary channel contains signals used for AIB initialization. All AIB channels (other than the auxiliary channel) within a column are of the same configuration (e.g., all TX, all RX, or half TX and half RX, as well as having the same number of data I/O signals). In an example, AIB channels are numbered in continuous increasing order starting with the AIB channel adjacent to the AUX channel. The AIB channel adjacent to the AUX is defined to be AIB channel zero.

In general, CPI interfaces of individual chiplets can include serialization-deserialization (SERDES) hardware. SERDES interconnects work well for scenarios in which high-speed signaling with low signal count are desirable. However, SERDES can result in additional power consumption and longer latencies for multiplexing and demultiplexing, error detection or correction (e.g., using block level cyclic redundancy checking (CRC)), link-level retry, or forward error correction. For ultra-short reach chiplet-to-chiplet interconnects where low latency or energy consumption is a primary concern, a parallel interface with clock rates that allow data transfer with minimal latency can be a better solution. CPI includes elements to minimize both latency and energy consumption in these ultra-short reach chiplet interconnects.

For flow control, CPI employs a credit-based technique. A CPI recipient, such as the application chiplet 125, provides a CPI sender, such as the memory controller chiplet 140, with credits that represent available buffers. In an example, a CPI recipient includes a buffer for each virtual channel for a given time-unit of transmission. Thus, if the CPI recipient supports five messages in time and a single virtual channel, the recipient has five buffers arranged in five rows (e.g., one row for each unit time). If four virtual channels are supported, then the CPI recipient has twenty buffers arranged in five rows. Each buffer is sized to hold the payload of one CPI packet.

When the CPI sender transmits to the CPI recipient, the sender decrements the available credits based on the transmission. Once all credits for the recipient are consumed, the sender stops sending packets to the recipient. This ensures that the recipient always has an available buffer to store the transmission.

As the recipient processes received packets and frees buffers, the recipient communicates the available buffer space back to the sender. This credit return can then be used by the sender to transmit additional information.

Also illustrated in FIGS. 1A and 1B is a chiplet mesh network 160 that uses a direct, chiplet-to-chiplet technique without the need for the NOC 130. The chiplet mesh network 160 can be implemented in CPI, or another chiplet-to-chiplet protocol. The chiplet mesh network 160 generally enables a pipeline of chiplets where one chiplet serves as the interface to the pipeline while other chiplets in the pipeline interface only with themselves.

Additionally, dedicated device interfaces, such as the memory interface 145, can also be used to interconnect chiplets, or to connect chiplets to external devices; such as the host interface chiplet 135 providing a PCIE interface external to the board 105 for the application chiplet 125. Such dedicated interfaces 145 are generally used when a convention or standard in the industry has converged on such an interface. The illustrated example of a Double Data Rate (DDR) interface 145 connecting the memory controller chiplet 140 to a dynamic random access memory (DRAM) memory device chiplet 150 is an example of such an industry convention.

Of the variety of possible support chiplets, the memory controller chiplet 140 is likely present in the chiplet system 110 due to the near omnipresent use of storage for computer processing as well as a sophisticated state-of-the-art for memories. Thus, using memory device chiplets 150 and memory controller chiplets 140 produced by others gives chiplet system designers access to robust products by sophisticated producers. Generally, the memory controller chiplet 140 provides a memory device specific interface to read, write, or erase data. Often, the memory controller chiplet 140 can provide additional features, such as error detection, error correction, maintenance operations, or atomic operation execution. Maintenance operations tend to be specific to the memory device chiplet 150, such as garbage collection in NAND flash or storage class memories, temperature adjustments (e.g., cross temperature management) in NAND flash memories. In an example, the maintenance operations can include logical-to-physical (L2P) mapping or management to provide a level of indirection between the physical and logical representation of data.

Atomic operations are a data manipulation performed by the memory controller chiplet 140. For example, an atomic operation of "increment" can be specified in a command by the application chiplet 125, the command including a memory address and possibly an increment value. Upon receiving the command, the memory controller chiplet 140 retrieves a number from the specified memory address, increments the number by the amount specified in the command, and stores the result. Upon a successful completion, the memory controller chiplet 140 provides an indication of the command's success to the application chiplet 125. Atomic operations avoid transmitting the data across the chiplet mesh network 160, resulting in lower latency execution of such commands.

Atomic operations can be classified as built-in atomics or programmable (e.g., custom) atomics. Built-in atomics are a finite set of operations that are immutably implemented in hardware. Programmable atomics are small programs that can run on a programmable atomic unit (PAU) (e.g., a custom atomic unit (CAU)) of the memory controller chiplet 140. An example of a memory controller chiplet 140 implementing a PAU is described in regard to FIG. 2.

The memory device chiplet 150 can be, or can include, any combination of volatile memory devices or non-volatile memories. Examples of volatile memory devices include, but are not limited to, random access memory (RAM), dynamic RAM (DRAM), synchronous DRAM (SDRAM), and graphics double data rate type 6 SDRAM (GDDR6 SDRAM). Examples of non-volatile memory devices include, but are not limited to, negative-and-(NAND)-type flash memory, storage class memory (e.g., phase-change memory or memristor based technologies), and ferroelectric RAM (FeRAM). The illustrated example of FIGS. 1A and 1B includes the memory device 150 as a chiplet, however, the memory device 150 can reside elsewhere, such as in a different package on the board 105.

Figure 2:
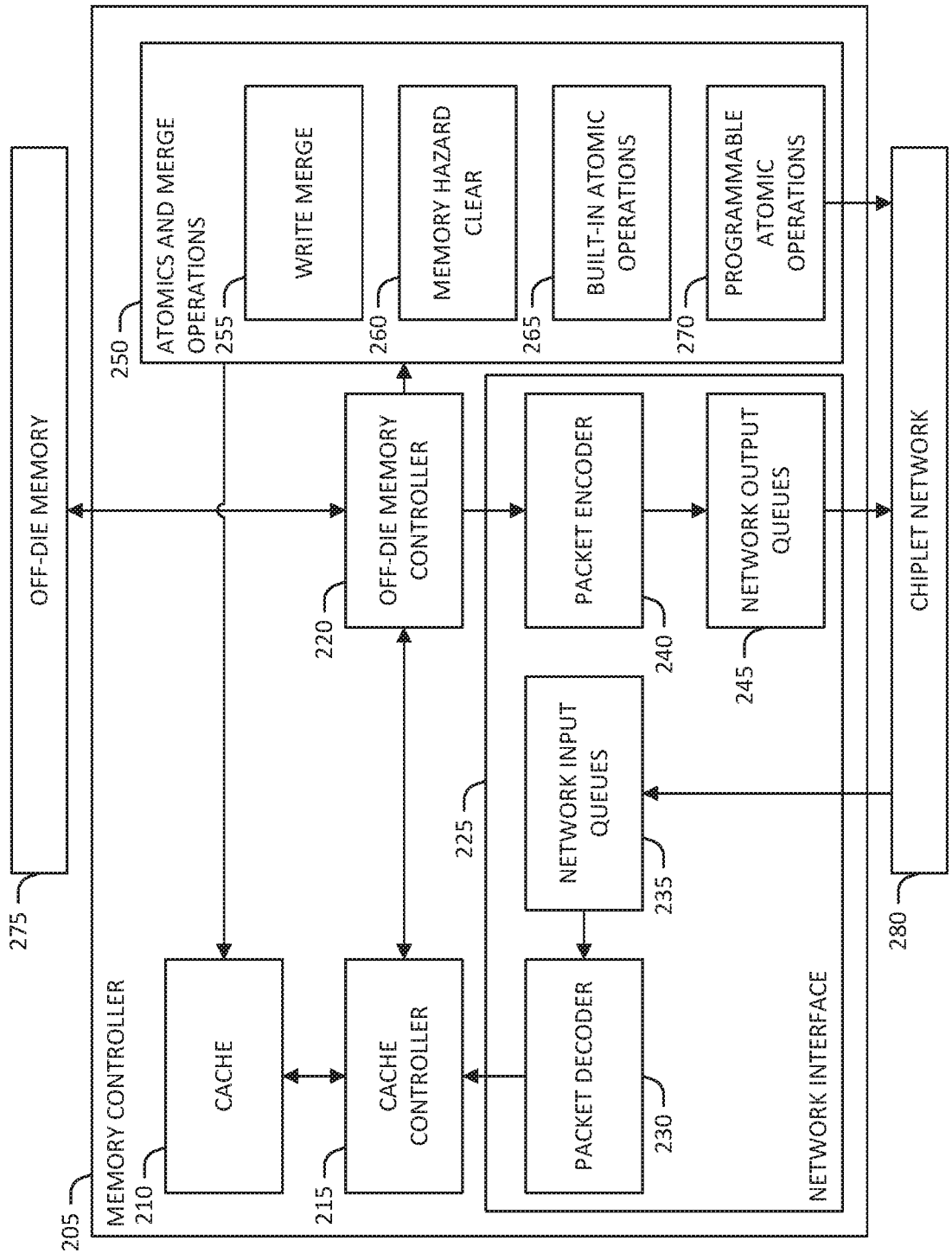
FIG. 2 is a block diagram of an example of a memory controller chiplet, in accordance with some examples described herein.

FIG. 2 illustrates components of an example of a memory controller chiplet 205, according to an embodiment. The memory controller chiplet 205 includes a cache 210, a cache controller 215, an off-die memory controller 220 (e.g., to communicate with off-die memory 275), a network communication interface 225 (e.g., to interface with a chiplet network 280 and communicate with other chiplets), and a set of atomic and merge operations 250. Members of this set can include a write merge unit 255, a hazard unit (260), built-in atomic unit 265, or a PAU 270. The various components are illustrated logically, and not as they necessarily would be implemented. For example, the built-in atomic unit 265 likely comprises different devices along a path to the off-die memory. In contrast, the programmable atomic operations 170 are likely implemented in a separate processor on the memory controller chiplet 105.

The off-die memory controller 220 is directly coupled to the off-die memory 275 (e.g., via a bus or other communication connection) to provide write operations and read operations to and from the off-die memory 275. The off-die memory controller 220 is also coupled for output to the atomic and merge operations unit 250, and for input to the cache controller 215 (e.g., a memory side cache controller).

The cache controller 215 is directly coupled to the cache 210, and also coupled to the network communication interface 225 for input (such as incoming read or write requests) and to the off-die memory controller 220 for output.

The network communication interface 225 includes a packet decoder 230, network input queues 235, a packet encoder 240, and network output queues 245 to support a packet-based chiplet network 280 (e.g., a CPI network). The chiplet network 280 can provide packet routing between and among processors, memory controllers, hybrid threading processors, configurable processing circuits, or communication interfaces. In such a packet-based communication system, each packet typically includes destination and source addressing, along with any data payload or instruction. In an example, the chiplet network 280 can be implemented as a collection of crossbar switches having a folded clos configuration, or a mesh network providing for additional connections, depending upon the configuration. The chiplet network 280 can be part of an asynchronous switching fabric. In this example, a data packet can be routed along any of various paths, such that the arrival of any selected data packet at an addressed destination can occur at any of a plurality of different times, depending upon the routing. The chiplet network 280 can be implemented as a synchronous communication network, such as a synchronous mesh communication network. Any and all such communication networks are considered equivalent and within the scope of the disclosure.

The memory controller chiplet 205 can receive a packet having a source address, a read request, and a physical address. In response, the off-die memory controller 220 or the cache controller 215 will read the data from the specified physical address (which can be in the off-die memory 275 or in the cache 210) and assemble a response packet to the source address containing the requested data. Similarly, the memory controller chiplet 205 can receive a packet having a source address, a write request, and a physical address. In response, the memory controller chiplet 205 will write the data to the specified physical address (which can be in the off-die memory 275 or in the cache 210) and assemble a response packet to the source address containing an acknowledgement that the data was stored to a memory.

Thus, the memory controller chiplet 205 can receive read and write requests via the chiplet network 280 and process the requests using the cache controller 215 interfacing with the cache 210. If the request cannot be handled by the cache controller 215, the off-die memory controller 220 handles the request by communication with the off-die memory 275, by the atomic and merge operations 250, or by both. Data read by the off-die memory controller 220 can be stored in the cache 210 by the cache controller 215 for later use.

The atomic and merge operations 250 are coupled to receive (as input) the output of the off-die memory controller 220, and to provide output to the cache 210, the network communication interface 225, or directly to the chiplet network 280. The memory hazard clear (reset) unit 260, write merge unit 265 and the built-in (e.g., predetermined) atomic operations unit 265 can each be implemented as state machines with other combinational logic circuitry (such as adders, shifters, comparators. AND gates, OR gates. XOR gates, or any suitable combination thereof) or other logic circuitry. These components can also include one or more registers or buffers to store operand or other data. The PAU 270 can be implemented as one or more processor cores or control circuitry, and various state machines with other combinational logic circuitry or other logic circuitry, and can also include one or more registers, buffers, or memories to store addresses, executable instructions, operand and other data, or can be implemented as a processor.

The write merge unit 255 receives read data and request data, and merges the request data and read data to create a single unit having the read data and the source address to be used in the response or return data packet). The write merge unit 255 provides the merged data to the write port of the cache 210 (or, equivalently, to the cache controller 215 to write to the cache 210). Optionally, the write merge unit 255 provides the merged data to the network communication interface 225 to encode and prepare a response or return data packet for transmission on the chiplet network 280.

When the request data is for a built-in atomic operation, the built-in atomic operations unit 265 receives the request and read data, either from the write merge unit 265 or directly from the off-die memory controller 220. The atomic operation is performed, and using the write merge unit 255, the resulting data is written to the cache 210, or provided to the network communication interface 225 to encode and prepare a response or return data packet for transmission on the chiplet network 280.

The built-in atomic operations unit 265 handles predefined atomic operations such as fetch-and-increment or compare-and-swap. In an example, these operations perform a simple read-modify-write operation to a single memory location of 32-bytes or less in size. Atomic memory operations are initiated from a request packet transmitted over the chiplet network 280. The request packet has a physical address, atomic operator type, operand size, and optionally up to 32-bytes of data. The atomic operation performs the read-modify-write to a cache memory line of the cache 210, filling the cache memory if necessary. The atomic operator response can be a simple completion response, or a response with up to 32-bytes of data. Example atomic memory operators include fetch-and-AND, fetch-and-OR, fetch-and-XOR, fetch-and-add, fetch-and-subtract, fetch-and-increment, fetch-and-decrement, fetch-and-minimum, fetch-and-maximum, fetch-and-swap, and compare-and-swap. In various example embodiments, 32-bit and 64-bit operations are supported, along with operations on 16 or 32 bytes of data. Methods disclosed herein are also compatible with hardware supporting larger or smaller operations and more or less data.

Built-in atomic operations can also involve requests for a "standard" atomic operation on the requested data, such as a comparatively simple, single cycle, integer atomics (e.g., fetch-and-increment or compare-and-swap), which will occur with the same throughput as a regular memory read or write operation not involving an atomic operation. For these operations, the cache controller 215 generally reserves a cache line in the cache 210 by setting a hazard bit (in hardware), so that the cache line cannot be read by another process while it is in transition. The data is obtained from either the off-die memory 275 or the cache 210, and is provided to the built-in atomic operation unit 265 to perform the requested atomic operation. Following the atomic operation, in addition to providing the resulting data to the data packet encoder 240 to encode outgoing data packets for transmission on the chiplet network 280, the built-in atomic operation unit 265 provides the resulting data to the write merge unit 255, which will also write the resulting data to the cache circuit 210. Following the writing of the resulting data to the cache 210, any corresponding hazard bit which was set will be cleared by the memory hazard clear unit 260.

The PAU 270 enables high performance (high throughput and low latency) for programmable atomic operations (also referred to as "custom atomic operations"), comparable to the performance of built-in atomic operations. Rather than executing multiple memory accesses, in response to an atomic operation request designating a programmable atomic operation and a memory address, circuitry in the memory controller chiplet 205 transfers the atomic operation request to PAU 270 and sets a hazard bit stored in a memory hazard register corresponding to the memory address of the memory line used in the atomic operation, to ensure that no other operation (read, write, or atomic) is performed on that memory line. The hazard bit is then cleared upon completion of the atomic operation. Additional direct data paths provided for the PAU 270 to execute the programmable atomic operations allow for additional write operations without any limitations imposed by the bandwidth of the communication networks and without increasing any congestion of the communication networks.

The PAU 270 include a RISC-V instruction set architecture (RISC-V ISA) based multi-threaded processor having one or more processor cores, and may further have an extended instruction set for executing programmable atomic operations. When provided with the extended instruction set for executing programmable atomic operations, the PAU 270 can be embodied as one or more hybrid threading processors. In some example embodiments, the PAU 270 provides barrel-style, round-robin instantaneous thread switching to maintain a high instruction-per-clock rate.

To achieve maximum performance (e.g., the highest instruction rate and highest bandwidth) within whatever operational environment the chiplet system may be used, throttling logic can be used limit the operation of the system to prevent thermal excursions and electrical supply rail demand excursions beyond the thermal and supply rail operating limits. As shown in FIG. 1B, throttle level information can be communicated among the chiplets using a throttle level bus 112. The chiplets change their operation based on the throttle level information to address excursions in temperature and supply power beyond predetermined limits.

Figure 3:
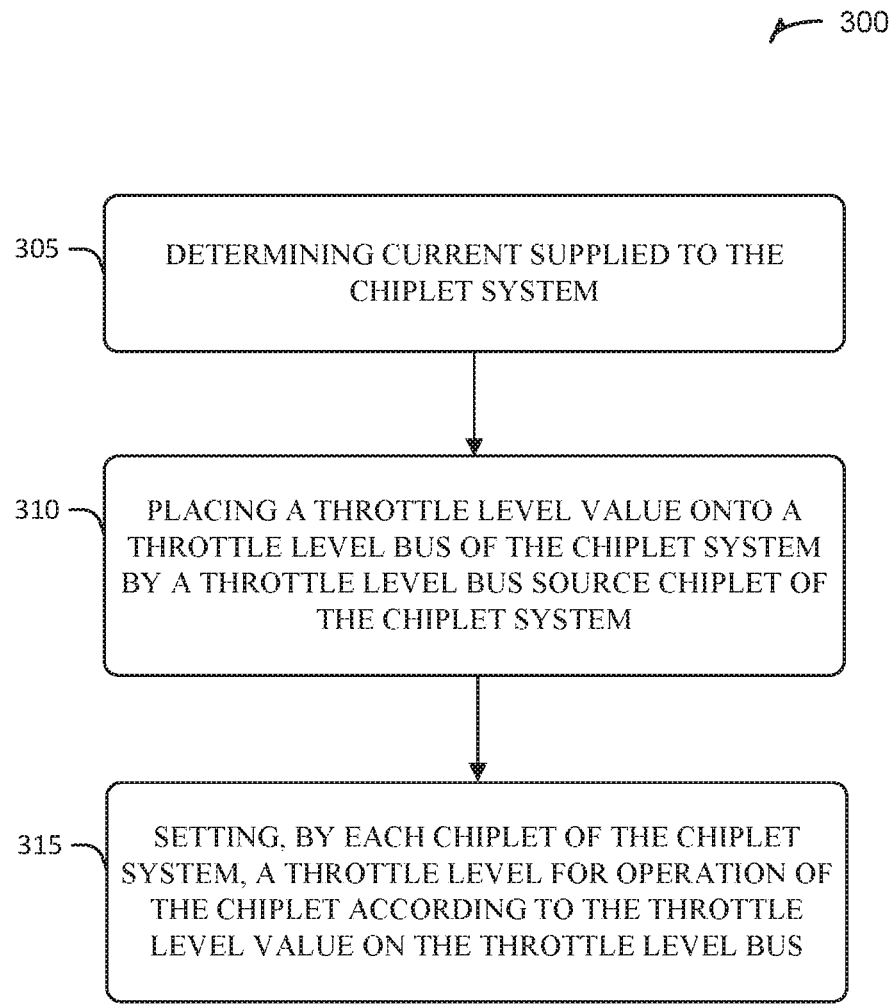
FIG. 3 is a flow diagram of a method of operating a chiplet-based system in accordance with some examples described herein.

FIG. 3 is a flow diagram of a method of operating a chiplet-based system to throttle the system to in response to thermal excursions and supply power excursions. At 305, the current supplied to the chiplet system is determined. The chiplet may include a current sensor to monitor the current supplied to the chiplet system. The chiplet system includes multiple chiplets and a throttle level bus connected to each of the chiplets.

At 310, a throttle level value is placed onto a throttle level bus of the chiplet system. The chiplet system includes a throttle level bus source chiplet that drives the throttle level value onto the throttle level bus. Any of the chiplets in the example chiplet-based system of FIG. 1 may be the throttle level bus source chiplet. The other chiplets are throttle level bus receiver chiplets. The throttle level value that the source chiplet places on the bus is determined by the measured supply current.

At 315, each chiplet of the chiplet system includes throttling logic circuitry to set its throttle level for operation of the chiplet according to the throttle level value on the throttle level bus. Throttling of a chiplet scales back the chiplet from its normal operation. The throttle level value on the bus causes the chiplets to implement a predetermined level of throttling. Multiple levels of throttling can be used. For example, when the chiplet system experiences an excursion above a current trip point, the chiplets operate under a first level of throttling (according to the value on the bus) that scales back operation of the chiplets from their normal operation. If the throttling does not produce the desired reduction in current, a throttle value for the next level of throttling is driven on the bus and the chiplets scale back their operation further according to the throttle value. Decreasing the throttle value moves the chiplets back toward their normal operation. If changing the level of throttling does not produce the desired reduction in supply current, an alarm signal can be generated that may produce a more drastic action such as shutting down the system or a portion of the system.

Figure 4:
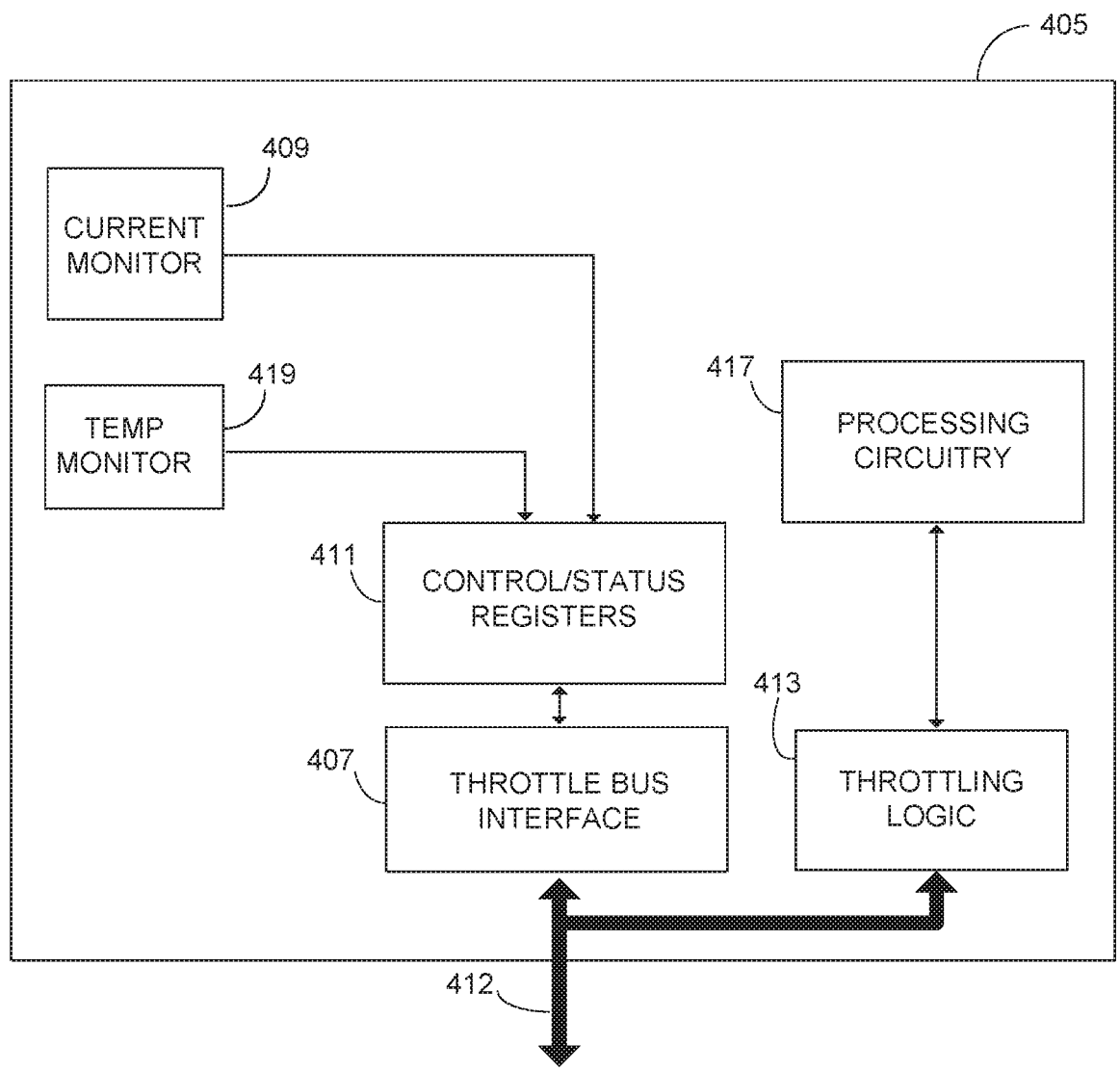
FIG. 4 is a block diagram of an example of a throttle level bus source chiplet in accordance with some examples described herein.

FIG. 4 is a block diagram of an example of a throttle level bus source chiplet 405. The throttle level bus source chiplet 405 includes a throttle level bus drive interface 407 connected to a throttle level bus 412. The chiplet-based system includes a current monitor circuit 409 to monitor the supply rail current of the chiplet-based system. The current monitor circuit 409 may be connected to, or integral to, the throttle level bus source chiplet. The current monitor circuit 409 indicates a current level of the supply rail current (e.g., by converting the supply current into a voltage proportional to the current). The current level is converted into a digital value and the throttle level bus source chiplet 405 may recurrently update one or more status or control registers 411 with the current level value. The throttle level bus source chiplet 405 sets the throttle level value of the bus according to the indicated current level.

The throttle level bus may be a single multi-drop 3-bit gray coded bus. The throttle level bus source chiplet drives the throttle level bus with a low data transition rate, but the throttle level value placed on the bus is gray-coded to eliminate asynchronous data exchange issues. Table 1 below shows an example of a 3-bit gray coded bus and corresponding throttle levels.

The throttle level bus source chiplet and the receiver chiplets each include throttling logic circuitry 413 that sets the throttle level of the chiplet according to the throttle level value on the bus. As explained previously herein, no throttling (e.g., corresponding to a bus value of "000" in Table 1) means that a chiplet is operating normally. Each increase in the throttle level reduces the performance of the chiplet to reduce the current demand of the chiplet.

TABLE 1

| Decimal Value | 3-bit Gray Coded Value | Throttling Level Description |
| --- | --- | --- |
| 0 | 0b000 | Throttle level 0 (throttling inactive) |
| 1 | 0b001 | Throttle level 1 |
| 2 | 0b011 | Throttle level 2 |
| 3 | 0b010 | Throttle level 3 |
| 4 | 0b110 | Throttle level 4 |
| 5 | 0b111 | Throttle level 5 |
| 6 | 0b101 | Throttle level 6 |
| 7 | 0b100 | Throttle level 7 (maximum throttling) |

For example, one or more of the chiplets may include at least one chiplet component configured to execute instructions encoded in one or both of software and firmware (e.g., processing circuitry 417 including one or more processors). To throttle operation, the throttling logic circuitry 413 may insert a number of no-operation (no-op) instructions into the instructions executed by the chiplet component. The number of no-op instructions inserted may increase with increasing value of throttle level.

In another example, the chiplet-based system may include a memory controller chiplet and a memory device chiplet as shown in the example of FIG. 1. To throttle operation, the throttling logic circuitry of the memory controller chiplet may halt accesses to a memory array of the memory device chiplet for a number of cycles. The number of halt or idle cycles may increase with increasing value of throttle level. Responses to the memory controller continue to be received and processed. Only new requests may be paused. The new requests may be queued with idle cycles queued with the requests.

In still another example, the chiplet-based system may include at least one chiplet having a reconfigurable switching fabric interconnecting tiles for processing. The number of tiles processing is tracked according to a tile count. To throttle operation, the throttling logic circuitry of the memory controller chiplet may stop the tiles for a number of cycles. The number of stop cycles may increase with increasing value of throttle level. The throttling logic circuitry 413 may initiate out-of-band signaling among components of the chiplet to communicate throttling information such as the throttling level to the components.

To address thermal excursions, the chiplet-based system includes a temperature monitor circuit 419. The temperature monitor circuit 419 may indicate temperature of a chiplet by generating a voltage proportional to temperature. The voltage is converted into a digital value representing temperature and the throttle level bus source chiplet 405 may recurrently update one or more status or control registers 411 with the digital temperature value.

In some examples, the throttle level bus source chiplet 405 sets the throttle level value of the bus according to the indicated temperature. In some examples, the throttle level bus source chiplet and each of the receiver chiplets include a temperature monitor circuit 419. In this case, the throttle level bus source chiplet may not place a value on the throttle level bus based on temperature. Instead, the throttling logic circuitry of each chiplet sets its own throttle level according to the temperature determined by its temperature monitoring circuit.

The throttle level bus source chiplet 405 includes one or more control and status registers 411. The control and status registers 411 are software accessible and may be read and written using the CPI network or using out-of-band signaling. The control and status registers 411 registers include register fields to adjust the response of the system to the current monitoring. The control and status registers 411 may include a current monitor timeout register field. The current monitor timeout register field is writeable to set a time interval for checking the current level of the system.

The control and status register 411 may include a throttle current trip point register field. The throttle current trip point register field is writeable to set a supply current trip point value. The throttle level bus source chiplet 405 increases the throttle level value on the bus at the end of the timeout time interval (set by the timeout register field) when the current level is determined to be greater than the current trip point value.

The control and status registers may include a lower current guard band register field and an upper current guard band register field. A lower current level value can be written into the lower current guard band register field to provide hysteresis to the throttling. As explained previously herein, the throttle level bus source chiplet 405 may increase the throttle level value on the bus when the supply current exceeds the current trip point. Instead of decreasing the throttle level when the supply current decreases back below the trip point, the throttle level bus source chiplet 405 may decrease the throttle level when the supply current decreases below the current value in the lower current guard band register field.

The upper current guard band register field is writeable to set an alarm condition. An alarm current level value is written into the upper current guard band register field. When the determined current level is greater than the alarm current level value the throttling logic circuitry of the throttle level bus source chiplet 405 asserts an alarm condition. The alarm condition is communicated to the chiplets of the system, such as by sending a signal or communicating a message for example. This may cause the chiplets to shut down or partially shut down their operation.

The one or more control and status registers of the throttle level bus source chiplets may include register fields that are also included in one or more control and status registers of the throttle level bus receiver chiplets. These register fields can include a throttling level register field, an override register field, a maximum throttle level enable register field, and a maximum throttle level register field. The throttling level register field is readable to indicate the current throttle level value of the chiplet. The override register field is writeable to a throttling level value by an external device such as a host device. The throttling level in the override register field overrides the throttling level indicated on the throttle level bus. The throttling logic circuitry of the chiplets sets operation of the chiplet according to the throttling level in the override register instead of the throttling level on the bus.

The maximum throttle level register field is writeable to a maximum throttling level that the chiplet is allowed to operate under. The maximum throttle level enable register field enables this limiting. If enabled, the chiplet continues to operate at the maximum allowable throttling level when the throttling level on the throttle level bus exceeds the maximum allowable throttling level.

If each of the throttle bus receiver chiplets includes a temperature monitor circuit, the one or more control and status registers of the throttle bus receiver chiplets can include an override disable register field and an override status register field. The override disable register is writeable to disable the override by the chiplet of the throttling level value on the bus (based on the override register field) when the temperature monitoring circuit indicates the temperature of the chiplet is above a specified threshold temperature. The override status register field is readable to indicate whether a chiplet is overriding the throttling level value of the bus.

If each chiplet includes a temperature monitor circuit, the control and status registers of the chiplets can include register fields similar to the current monitoring register fields to adjust the response of the system to the temperature monitoring.

The throttle level source chiplet and receiver chiplets can also include a temperature monitor timeout register field, a throttle temperature trip point register field, a lower temperature guard band register field, and an upper temperature guard band register field. The temperature monitor timeout register field is writeable to set a time interval for checking the temperature of the chiplet. The throttle temperature trip point register field is writeable to set a temperature trip point value for the throttling logic circuitry of the chiplet. The throttling logic circuitry increases the throttle level of the chiplet at the end of the timeout time interval when the temperature is determined to be greater than the throttle temperature trip point value.

The lower temperature guard band register field is writeable to set a lower temperature value. The throttling logic circuitry of the chiplet decreases the throttle level of the chiplet at the end of the timeout time interval when the temperature is determined to be less than the lower temperature value in the lower temperature guard band register field. The upper guard band register field is writeable to set an alarm temperature value. An alarm condition is asserted when the temperature is greater than the alarm temperature value. The chiplet may shut down or partially shutdown operation when the alarm condition is asserted.

Figure 5:
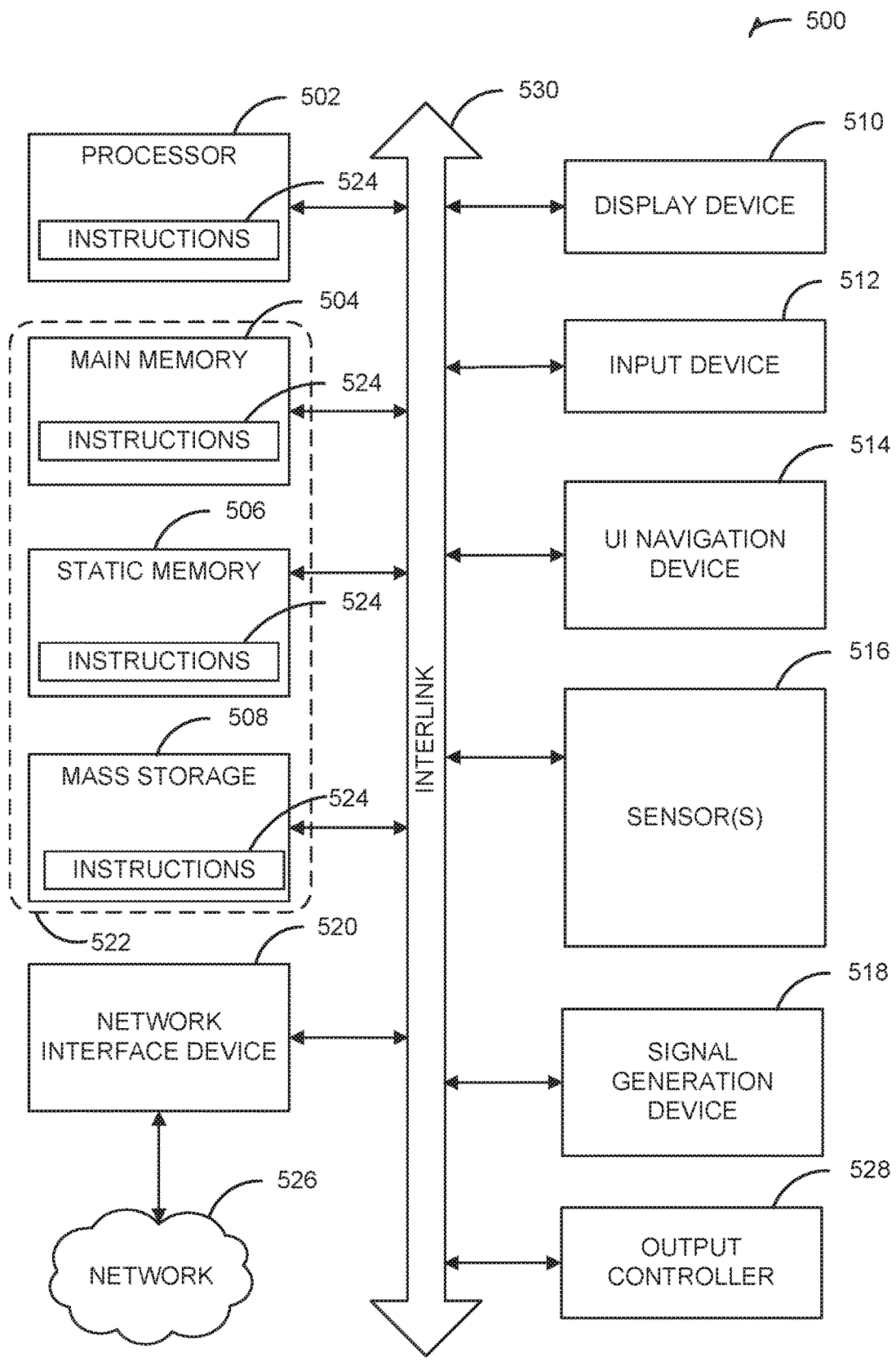
FIG. 5 illustrates a block diagram of an example machine in accordance with some examples described herein.

FIG. 5 illustrates a block diagram of an example machine 500 upon which any one or more of the techniques (e.g., methodologies) discussed herein may be implemented. Examples, as described herein, may include, or may operate by, logic or a number of components, or mechanisms in the machine 500. Circuitry (e.g., processing circuitry) is a collection of circuits implemented in tangible entities of the machine 500 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine-readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the machine 500 follow.

In alternative embodiments, the machine 500 may operate as a standalone device or may be connected (e.g., networked) to other machines. In a networked deployment, the machine 500 may operate in the capacity of a server machine, a client machine, or both in server-client network environments. In an example, the machine 500 may act as a peer machine in peer-to-peer (P2P) (or other distributed) network environment. The machine 500 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine (e.g., computer system) 500 may include a hardware processor 502 (e.g., a central processing unit (CPU), a graphics processing unit (GPU), a hardware processor core, or any combination thereof), a main memory 504, a static memory (e.g., memory or storage for firmware, microcode, a basic-input-output (BIOS), unified extensible firmware interface (UEFI), etc.) 506, and mass storage 508 (e.g., hard drives, tape drives, flash storage, or other block devices) some or all of which may communicate with each other via an interlink (e.g., bus) 530. The machine 500 may further include a display unit 510, an alphanumeric input device 512 (e.g., a keyboard), and a user interface (UI) navigation device 514 (e.g., a mouse). In an example, the display unit 510, input device 512 and UI navigation device 514 may be a touch screen display. The machine 500 may additionally include a storage device (e.g., drive unit) 508, a signal generation device 518 (e.g., a speaker), a network interface device 520, and one or more sensors 516, such as a global positioning system (GPS) sensor, compass, accelerometer, or other sensor. The machine 500 may include an output controller 528, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 502, the main memory 504, the static memory 506, or the mass storage 508 may be, or include, a machine readable medium 522 on which is stored one or more sets of data structures or instructions 524 (e.g., software) embodying or utilized by any one or more of the techniques or functions described herein. The instructions 524 may also reside, completely or at least partially, within any of registers of the processor 502, the main memory 504, the static memory 506, or the mass storage 508 during execution thereof by the machine 500. In an example, one or any combination of the hardware processor 502, the main memory 504, the static memory 506, or the mass storage 508 may constitute the machine-readable media 522. While the machine-readable medium 522 is illustrated as a single medium, the term "machine readable medium" may include a single medium or multiple media (e.g., a centralized or distributed database, and/or associated caches and servers) configured to store the one or more instructions 524.

The term "machine-readable medium" may include any medium that is capable of storing, encoding, or carrying instructions for execution by the machine 500 and that cause the machine 500 to perform any one or more of the techniques of the present disclosure, or that is capable of storing, encoding or carrying data structures used by or associated with such instructions. Non-limiting machine-readable medium examples may include solid-state memories, optical media, magnetic media, and signals (e.g., radio frequency signals, other photon-based signals, sound signals, etc.). In an example, a non-transitory machine-readable medium comprises a machine-readable medium with a plurality of particles having invariant (e.g., rest) mass, and thus are compositions of matter. Accordingly, non-transitory machine-readable media are machine readable media that do not include transitory propagating signals. Specific examples of non-transitory machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

In an example, information stored or otherwise provided on the machine readable medium 522 may be representative of the instructions 524, such as instructions 524 themselves or a format from which the instructions 524 may be derived. This format from which the instructions 524 may be derived may include source code, encoded instructions (e.g., in compressed or encrypted form), packaged instructions (e.g., split into multiple packages), or the like. The information representative of the instructions 524 in the machine readable medium 522 may be processed by processing circuitry into the instructions to implement any of the operations discussed herein. For example, deriving the instructions 524 from the information (e.g., processing by the processing circuitry) may include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 524.

In an example, the derivation of the instructions 524 may include assembly, compilation, or interpretation of the information (e.g., by the processing circuitry) to create the instructions 524 from some intermediate or preprocessed format provided by the machine readable medium 522. The information, when provided in multiple parts, may be combined, unpacked, and modified to create the instructions 524. For example, the information may be in multiple compressed source code packages (or object code, or binary executable code, etc.) on one or several remote servers. The source code packages may be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 524 may be further transmitted or received over a communications network 526 using a transmission medium via the network interface device 520 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks). Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 520 may include one or more physical jacks (e.g., Ethernet, coaxial, or phone jacks) or one or more antennas to connect to the communications network 526. In an example, the network interface device 520 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 500, and includes digital or analog communications signals or other intangible medium to facilitate communication of such software. A transmission medium is a machine readable medium.

In the foregoing specification, some example implementations of the disclosure have been described. It will be evident that various modifications can be made thereto without departing from the broader scope of the disclosure as set forth in the following claims. The specification and drawings are, accordingly, to be regarded in an illustrative sense rather than in a restrictive sense. Below is a non-exhaustive list of examples of implementations of the present disclosure.

Example 1 includes subject matter (such as a chiplet system) comprising an interposer including conductive interconnect, wherein the conductive interconnect includes a throttle level bus, and multiple chiplets arranged on the interposer and connected to the throttle level bus. The multiple chiplets include a throttle level bus source chiplet including a throttle level bus drive interface configured to place a throttle level value onto the throttle level bus, one or more throttle level bus receiver chiplets operatively coupled to the throttle level bus, and each chiplet of the multiple chiplets including throttling logic circuitry configured to set a throttle level of a chiplet according to the throttle level value.

In Example 2, the subject matter of Example 1 optionally includes a current monitor circuit configured to determine a current level of supply rail current of the chiplet system, and wherein the throttle level bus source chiplet is configured to set the throttle level value according to the determined current level.

In Example 3, the subject matter of one or both of Examples 1 and 2 optionally includes a temperature monitor circuit, and throttling logic circuitry configured to set a throttle level according to a temperature determined by the temperature monitoring circuit.

In Example 4, the subject matter of one or any combination of Examples 1-3 optionally includes each chiplet of the multiple chiplets includes one more control and status registers that include one or more of: a throttling level register field, readable to indicate the current throttle level value, an override register field, writeable to a throttling level value by a host device to override the throttling level value of the bus, a maximum throttle level enable register field, writeable to enable operating the chiplets at a maximum allowable throttling level, and a maximum throttle level register field, writeable to a maximum throttling level allowed when enabled by the maximum throttle level enable register field.

In Example 5, the subject matter of one or any combination of Examples 1-3 optionally includes each throttle level bus receiver chiplet includes a temperature monitor circuit and one more control and status registers, and one more control and status registers include one or both of: an override disable register field, writeable to disable the override by the chiplet of the throttling level value of the bus when the temperature monitoring circuit indicates the temperature of the chiplet is above a specified threshold temperature, and an override status register field, readable to indicate whether a chiplet is overriding the throttling level value of the bus.

In Example 6, the subject matter of one or any combination of Examples 1-5 optionally includes a current monitor timeout register field, writeable to set a time interval for checking the current level, a throttle current trip point register field, writeable to set a current trip point value, wherein the throttle level bus value is increased at the end of the time interval when the current level is determined to be greater than the current trip point value, a lower current guard band register field, writeable to set a lower current level value, wherein the throttle level bus value is decreased at the end of the time interval when the current level is determined to be less than the lower current level value, and an upper current guard band register field, writeable to set an alarm current level value, wherein an alarm condition is asserted when the determined current level is greater than the alarm current level value.

In Example 7, the subject matter of one or both of Examples 1 and 2 optionally includes each chiplet including a temperature monitor circuit and one more control and status registers that include one or both of a temperature monitor timeout register field, writeable to set a time interval for checking the temperature of the chiplet, a throttle temperature trip point register field, writeable to set a temperature trip point value, wherein a throttle level of the chiplet is increased at the end of the timeout time interval when the temperature is determined to be greater than the throttle temperature trip point value, a lower temperature guard band register field, writeable to set a lower temperature value, wherein the throttle level of the chiplet is decreased at the end of the timeout time interval when the temperature is determined to be less than the lower temperature value, and an upper temperature guard band register field, writeable to set an alarm temperature value, wherein an alarm condition is asserted when the temperature is greater than the alarm temperature value.

In Example 8, the subject matter of one or any combination of Examples 1-7 optionally includes a memory controller chiplet including a memory controller and a memory device chiplet, and throttling logic circuitry of the memory controller chiplet configured to halt access to a memory array of the memory device chiplet for a number of cycles specified by the throttle level value on the throttle level bus.

In Example 9, the subject matter of one or any combination of Examples 1-8 optionally includes at least one chiplet of the multiple chiplets includes a chiplet component configured to execute instructions encoded in one or both of software and firmware, and throttling logic circuitry of the at least one chiplet configured to insert a number of no-operation instructions specified by the throttle level value into the instructions executed by the at least one chiplet component.

In Example 10, the subject matter of one or any combination of Examples 1-9 optionally includes at least one chiplet of the multiple chiplets includes a reconfigurable switching fabric interconnecting a number of processing tiles that transfer data according to a tile count, and throttling logic circuitry of the at least one chiplet configured to stop the tile count for a number of cycles determined by the throttle level value on the throttle level bus.

In Example 11, the subject matter of one or any combination of Examples 1-10 optionally includes throttling logic circuitry configured to initiate out-of-band signaling within the chiplet to communicate throttling information to components of the chiplet.

Example 12, includes subject matter (such as a method) or can optionally be combined with one or any combination of Examples 1-11 to include such subject matter comprising determining current supplied to a chiplet system, placing a throttle level value onto a throttle level bus of the chiplet system by a throttle level bus source chiplet of the chiplet system, wherein the throttle level value is determined according to the determined current, and setting, by each chiplet of the chiplet system, a throttle level for operation of the chiplet according to the throttle level value on the throttle level bus.

In Example 13, the subject matter of Example 12 optionally includes reading a current throttle value of a throttling level register field of a chiplet, the throttling level register field indicating the throttle level value of the throttle level bus, and setting an operating throttle level value of the chiplet to an override throttle level value stored in an override register field of the chiplet.

In Example 14, the subject matter of one or both of Examples 12 and 13 optionally includes setting an operating throttle level of a chiplet to a specified maximum allowable throttling level when the maximum allowable throttling level is enabled in a maximum throttle level enable register field of the chiplet.

In Example 15, the subject matter of one or any combination of Examples 12-14 optionally includes recurrently checking the current level of the chiplet system according to a specified time interval, increasing the throttle level bus value upon expiration of the time interval when the current level is determined to be greater than a current trip point value, decreasing the throttle level bus value upon expiration of the time interval when the current level is determined to be less than a specified lower guard band current value, and generating an alarm signal when the current level is determined to be greater than a specified upper guard band current value.

In Example 16, the subject matter of one or any combination of Examples 12-15 optionally includes each chiplet setting the throttle level for operation of the chiplet according to a determined temperature of the chiplet.

In Example 17, the subject matter of Example 16 optionally includes overriding the throttle level value of the bus when the determined temperature of the chiplet is above a specified threshold temperature, and setting an override status register field of the chiplet to indicate that the throttle level value of the bus is overridden.

In Example 18, the subject matter of Example 16 optionally includes recurrently checking the temperature of a chiplet according to a specified time interval, increasing a throttle level of the chiplet upon expiration of the time interval when the temperature is determined to be greater than a specified throttle temperature trip point value, decreasing the throttle level of the chiplet upon expiration of the time interval when the temperature is determined to be less than a specified lower guard band temperature, and generating an alarm signal upon expiration of the time interval when the temperature is determined to be greater than a specified alarm temperature value.

In Example 19, the subject matter of one or any combination of Examples 12-18 optionally includes halting access, by a memory controller chiplet of the chiplet system, to a memory array of a memory device chiplet for a number of cycles specified by the throttle level value of the throttle level bus.

In Example 20, the subject matter of one or any combination of Examples 12-19 optionally includes executing, by at least one chiplet component of a chiplet of the chiplet system, instructions encoded in one or both of software and firmware, and inserting a number of no-operation instructions specified by the throttle level value of the throttle level bus into the instructions executed by the at least one chiplet component.

In Example 21, the subject matter of one or any combination of Examples 12-20 optionally includes at least one chiplet of the multiple chiplets includes a reconfigurable switching fabric interconnecting a number of processing tiles that transfer data according to a tile count, and the method further including stopping the tile count for a number of cycles determined by the throttle level value on the throttle level bus.

Example 22 includes subject matter (such as a memory device) or can optionally be combined with one or any combination of Example 1-21 to include such subject matter, comprising an interposer including conductive interconnect, wherein the conductive interconnect includes a throttle level bus, and multiple chiplets arranged on the interposer and connected to the throttle level bus. The multiple chiplets include a throttle level bus source chiplet including a throttle level bus drive interface configured to place a throttle level value onto the bus, one or more throttle level bus receiver chiplets operatively coupled to the throttle level bus including a memory controller chiplet and a memory device chiplet, and each chiplet of the multiple chiplets including throttling logic circuitry configured to set a throttle level of a chiplet according to the throttle level value.

In Example 23, the subject matter of Example 22 optionally includes a current monitor circuit configured to determine a current level of supply rail current of the chiplet system, and a throttle level bus source chiplet configured to set the throttle level value according to the determined current level.

In Example 24, the subject matter of one or both of Examples 22 and 23 optionally includes each chiplet of the chiplet system including a temperature monitor circuit, and throttling logic circuitry of each chiplet configured to set a throttle level of the chiplet according to a temperature determined by the temperature monitoring circuit.

These several Examples can be combined in any permutation or combination.

What is claimed is:

1. A system comprising:
   an interposer including conductive interconnect, wherein the conductive interconnect includes a throttle level bus;
   multiple chiplets arranged on the interposer and connected to the throttle level bus, the multiple chiplets including:
   a source chiplet including a driver configured to place a throttle level value onto the throttle level bus;
   one or more receiver chiplets coupled to the throttle level bus;
   each chiplet of the multiple chiplets including circuitry configured to set a throttle level of a chiplet according to the throttle level value on the throttle level bus; and
   one or more control and status registers that include one or more of:
   a throttling level register field, readable to indicate the current throttle level value;
   an override register field, writeable to a throttling level value by a host device to override the throttling level value of the throttle level bus;
   a maximum throttle level enable register field, writeable to enable operating the chiplets at a maximum allowable throttling level; and
   a maximum throttle level register field, writeable to a maximum throttling level allowed when enabled by the maximum throttle level enable register field.

2. The system of claim 1, including:
   a current monitor circuit configured to determine a current level of supply rail current of the chiplet system; and
   wherein the source chiplet is configured to set the throttle level value according to the determined current level.

3. The system of claim 1, including a temperature monitor circuit,
   wherein the circuitry is configured to set a throttle level according to a temperature determined by the temperature monitoring circuit.

4. The system of claim 1, wherein each receiver chiplet includes:
a temperature monitor circuit; and
wherein the one or more control and status registers include one or both of:
an override disable register field, writeable to disable the override by the receiver chiplet of the throttling level value of the throttle level bus when the temperature monitoring circuit indicates the temperature of the receiver chiplet is above a specified threshold temperature; and
an override status register field, readable to indicate whether a chiplet is overriding the throttling level value of the throttle level bus.

5. The system of claim 1, wherein the source chiplet includes one or more of:
a current monitor timeout register field, writeable to set a time interval for checking the current level;
a throttle current trip point register field, writeable to set a current trip point value, wherein the throttle level bus value is increased at the end of the time interval when the current level is determined to be greater than the current trip point value;
a lower current guard band register field, writeable to set a lower current level value, wherein the throttle level bus value is decreased at the end of the time interval when the current level is determined to be less than the lower current level value; and
an upper current guard band register field, writeable to set an alarm current level value, wherein an alarm condition is asserted when the determined current level is greater than the alarm current level value.

6. The system of claim 1, wherein each chiplet of the multiple chiplets includes:
a temperature monitor circuit; and
wherein the one or more control and status registers include one or both of:
a temperature monitor timeout register field, writeable to set a time interval for checking the temperature of the chiplet;
a throttle temperature trip point register field, writeable to set a temperature trip point value, wherein a throttle level of the chiplet is increased at the end of the timeout time interval when the temperature is determined to be greater than the throttle temperature trip point value;
a lower temperature guard band register field, writeable to set a lower temperature value, wherein the throttle level of the chiplet is decreased at the end of the timeout time interval when the temperature is determined to be less than the lower temperature value; and
an upper temperature guard band register field, writeable to set an alarm temperature value, wherein an alarm condition is asserted when the temperature is greater than the alarm temperature value.

7. The system of claim 1,
wherein the multiple chiplets include a memory controller chiplet including a memory controller and a memory device chiplet; and
circuitry configured to halt access to a memory array of the memory device chiplet for a number of cycles specified by the throttle level value on the throttle level bus.

8. The system of claim 1,
wherein at least one chiplet of the multiple chiplets includes a chiplet component configured to execute instructions encoded in one or both of software and firmware; and
wherein the throttling logic circuitry of the at least one chiplet is configured to insert a number of no-operation instructions specified by the throttle level value into the instructions executed by the at least one chiplet component.

9. The system of claim 1,
wherein at least one chiplet of the multiple chiplets includes a reconfigurable switching fabric interconnecting a number of processing tiles that transfer data according to a tile count; and
wherein the circuitry configured to set the throttle level of the at least one chiplet is further configured to stop the tile count for a number of cycles determined by the throttle level value on the throttle level bus.

10. The system of claim 1, wherein the circuitry configured to set the throttle level of the at least one chiplet is further configured to initiate out-of-band signaling within the chiplet to communicate throttling information to components of the chiplet.

11. A method comprising:
determining current supplied to a chiplet system;
applying a voltage corresponding to a throttle level value onto a throttle level bus of the chiplet system by a source chiplet of the chiplet system, wherein the voltage corresponding to the throttle level value is determined according to the determined current;
setting, by each chiplet of the chiplet system, an operating throttle level for operation of the chiplet according to the throttle level value on the throttle level bus;
reading a current throttle value of a throttling level register field of a chiplet, the throttling level register field indicating the throttle level value of the throttle level bus; and
setting an operating throttle level value of the chiplet to an override throttle level value stored in an override register field of the chiplet.

12. The method of claim 11, including setting an operating throttle level of a chiplet to a specified maximum allowable throttling level when the maximum allowable throttling level is enabled in a maximum throttle level enable register field of the chiplet.

13. The method of claim 11, including:
recurrently checking the current level of the chiplet system according to a specified time interval;
increasing the throttle level bus value upon expiration of the time interval when the current level is determined to be greater than a current trip point value;
decreasing the throttle level bus value upon expiration of the time interval when the current level is determined to be less than a specified lower guard band current value; and
generating an alarm signal when the current level is determined to be greater than a specified upper guard band current value.

14. The method of claim 11, including each chiplet setting the throttle level for operation of the chiplet according to a determined temperature of the chiplet.

15. The method of claim 11, wherein setting the throttle level for operation of the chiplet according to a determined temperature of the chiplet includes:
overriding the throttle level value of the bus when the determined temperature of the chiplet is above a specified threshold temperature; and
setting an override status register field of the chiplet to indicate that the throttle level value of the bus is overridden.

16. The method of claim 11, including:
recurrently checking the temperature of a chiplet according to a specified time interval;
increasing a throttle level of the chiplet upon expiration of the time interval when the temperature is determined to be greater than a specified throttle temperature trip point value;
decreasing the throttle level of the chiplet upon expiration of the time interval when the temperature is determined to be less than a specified lower guard band temperature; and
generating an alarm signal upon expiration of the time interval when the temperature is determined to be greater than a specified alarm temperature value.

17. The method of claim 11, including halting access, by a memory controller chiplet of the chiplet system, to a memory array of a memory device chiplet for a number of cycles specified by the throttle level value of the throttle level bus.

18. The method of claim 11,
executing, by at least one chiplet component of a chiplet of the chiplet system, instructions encoded in one or both of software and firmware; and
inserting a number of no-operation instructions specified by the throttle level value of the throttle level bus into the instructions executed by the at least one chiplet component.

19. The method of claim 11,
wherein at least one chiplet of the multiple chiplets includes a reconfigurable switching fabric interconnecting a number of processing tiles that transfer data according to a tile count; and
wherein the method further includes stopping the tile count for a number of cycles determined by the throttle level value on the throttle level bus.

20. A memory device including:
an interposer including conductive interconnect, wherein the conductive interconnect includes a throttle level bus;
multiple chiplets arranged on the interposer and connected to the throttle level bus, the multiple chiplets including:
a source chiplet including a throttle level bus drive interface configured to place a throttle level value onto the bus;
one or more receiver chiplets operatively coupled to the throttle level bus including a memory controller chiplet and a memory device chiplet; and
each chiplet of the multiple chiplets including throttling logic circuitry configured to set a throttle level of a chiplet according to the throttle level value; and
a maximum throttle level enable register field, writeable to enable operating the chiplets at a maximum allowable throttling level, wherein each chiplet is set to an operating throttle level of the chiplet to a specified maximum allowable throttling level when the maximum allowable throttling level is enabled in the maximum throttle level enable register field of the chiplet.

21. The memory device of claim 20, including:
a current monitor circuit configured to determine a current level of supply rail current of the chiplet system; and
wherein the source chiplet is configured to set the throttle level value according to the determined current level.

22. The memory device of claim 20, wherein each chiplet of the chiplet system includes a temperature monitor circuit; and
wherein the throttling logic circuitry of each chiplet is configured to set a throttle level of the chiplet according to a temperature determined by the temperature monitoring circuit.

* * * * *